(12) United States Patent
Qian et al.

(10) Patent No.: US 11,329,098 B2
(45) Date of Patent: May 10, 2022

(54) PIEZOELECTRIC MICROMACHINED ULTRASONIC TRANSDUCERS AND METHODS FOR FABRICATING THEREOF

(71) Applicant: VANGUARD INTERNATIONAL SEMICONDUCTOR SINGAPORE PTE. LTD., Singapore (SG)

(72) Inventors: You Qian, Singapore (SG); Humberto Campanella-Pineda, Singapore (SG); Rakesh Kumar, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 752 days.

(21) Appl. No.: 16/183,822

(22) Filed: Nov. 8, 2018

(65) Prior Publication Data

US 2020/0152697 A1 May 14, 2020

(51) Int. Cl.
*H01L 27/20* (2006.01)
*H01L 41/04* (2006.01)
(Continued)

(52) U.S. Cl.
CPC ............ *H01L 27/20* (2013.01); *B06B 1/0207* (2013.01); *B06B 1/0666* (2013.01);
(Continued)

(58) Field of Classification Search
CPC ..... B06B 1/0666; B06B 1/0207; H01L 27/20; H01L 41/332; H01L 41/29; H01L 41/23;
(Continued)

(56) References Cited

U.S. PATENT DOCUMENTS

2013/0051179 A1 2/2013 Hong
2013/0119490 A1* 5/2013 Harame ................. H01L 21/84
716/110

(Continued)

FOREIGN PATENT DOCUMENTS

CN 100400184 C 7/2008
CN 101578686 A 11/2009
(Continued)

OTHER PUBLICATIONS

Notice of Allowance issued for corresponding TW Application No. 108119751 dated Nov. 27, 2019, 5 pages ncluding the English translation of 2 pages (For Information Purpose Only).

*Primary Examiner* — Brigitte A Paterson
(74) *Attorney, Agent, or Firm* — Winston Hsu

(57) ABSTRACT

According to various embodiments, a PMUT device may include a wafer, an active layer including a piezoelectric stack, an intermediate layer having a cavity therein where the intermediate layer is disposed between the wafer and the active layer such that the cavity is adjoining the piezoelectric stack. A via may be formed through the active layer and the intermediate layer to the wafer. A metallic layer may be disposed over the active layer and over surfaces of the via. The intermediate layer may include an interposing material surrounding the cavity, and may further include a sacrificial material surrounding the via. The sacrificial material may be different from the interposing material. The metallic layer may include a first member at least substantially overlapping the piezoelectric stack, a second member extending from the first member to the cavity, and a third member extending into the active layer to contact an electrode therein.

19 Claims, 8 Drawing Sheets

(51) Int. Cl.

| | |
|---|---|
| *B06B 1/06* | (2006.01) |
| *H01L 41/047* | (2006.01) |
| *H01L 41/053* | (2006.01) |
| *H01L 41/23* | (2013.01) |
| *H01L 41/29* | (2013.01) |
| *H01L 41/332* | (2013.01) |
| *B06B 1/02* | (2006.01) |
| *H01L 41/08* | (2006.01) |
| *B81B 3/00* | (2006.01) |
| *B81C 1/00* | (2006.01) |
| *B81B 7/00* | (2006.01) |

(52) U.S. Cl.
CPC .......... *B81B 3/0021* (2013.01); *B81B 3/0086* (2013.01); *B81B 7/0064* (2013.01); *B81C 1/00246* (2013.01); *B81C 1/00301* (2013.01); *H01L 41/042* (2013.01); *H01L 41/0475* (2013.01); *H01L 41/0533* (2013.01); *H01L 41/0825* (2013.01); *H01L 41/23* (2013.01); *H01L 41/29* (2013.01); *H01L 41/332* (2013.01); *B81B 2207/07* (2013.01); *B81C 2203/0735* (2013.01)

(58) Field of Classification Search
CPC ............. H01L 41/0825; H01L 41/0533; H01L 41/0475; H01L 41/042
See application file for complete search history.

(56) References Cited

U.S. PATENT DOCUMENTS

| | | |
|---|---|---|
| 2013/0162102 A1 | 6/2013 | Sammoura |
| 2013/0200753 A1 | 8/2013 | Dausch et al. |
| 2013/0293065 A1 | 11/2013 | Hajati et al. |
| 2015/0165479 A1 | 6/2015 | Lasiter et al. |
| 2015/0169136 A1 | 6/2015 | Ganti et al. |
| 2015/0357375 A1 | 12/2015 | Tsai et al. |
| 2016/0107194 A1 | 4/2016 | Panchawagh et al. |
| 2016/0117541 A1 | 4/2016 | Lu et al. |
| 2016/0262725 A1 | 9/2016 | Boser et al. |
| 2017/0066014 A1* | 3/2017 | Kidwell, Jr. .......... B81B 3/0097 |
| 2017/0110504 A1* | 4/2017 | Panchawagh ......... H01L 41/311 |
| 2017/0275158 A1* | 9/2017 | Shin .................... H01L 41/1138 |
| 2019/0177160 A1 | 6/2019 | Qian et al. |
| 2019/0273116 A1* | 9/2019 | Goktepeli ............... H01L 27/20 |

FOREIGN PATENT DOCUMENTS

| | | |
|---|---|---|
| CN | 102205311 A | 10/2011 |
| CN | 102670259 A | 9/2012 |
| CN | 102933318 A | 2/2013 |
| CN | 104837096 A | 8/2015 |
| CN | 104860258 A | 8/2015 |
| CN | 105378756 A | 3/2016 |
| CN | 105873689 A | 8/2016 |
| CN | 106132568 A | 11/2016 |
| CN | 106660074 A | 5/2017 |
| CN | 107092880 A | 8/2017 |
| CN | 107199169 A | 9/2017 |
| CN | 107394036 A | 11/2017 |
| CN | 107394037 A | 11/2017 |
| CN | 107511318 A | 12/2017 |
| CN | 207254707 U | 4/2018 |
| CN | 108121976 A | 6/2018 |
| CN | 108140115 A | 6/2018 |
| CN | 108147360 A | 6/2018 |
| CN | 108217581 A | 6/2018 |
| CN | 108288669 A | 7/2018 |
| CN | 207780807 U | 8/2018 |
| CN | 108701751 A | 10/2018 |
| WO | 2016/106153 A1 | 6/2016 |

* cited by examiner

PIEZOELECTRIC MICROMACHINED ULTRASONIC TRANSDUCERS AND METHODS FOR FABRICATING THEREOF

TECHNICAL FIELD

Various embodiments relate to piezoelectric micromachined ultrasonic transducers (PMUT) and methods for fabricating PMUTs.

BACKGROUND

PMUTs have multiple applications, including fingerprint-based authentication and gesture recognition on touch screens. Fingerprinting for mobile applications generally require the PMUT to operate in high frequencies. The high frequency PMUTs may be fabricated by bonding a Micro-Electro-Mechanical Systems (MEMS) device to a CMOS wafer, or building the PMUT monolithically on a CMOS wafer. Fabricating the PMUT by wafer bonding may introduce bonding yield and complex interconnect design factors, whereas fabricating the PMUT monolithically may result in a longer fabrication process as the MEMS device and the CMOS wafer have to be serially fabricated. Moreover, existing technologies for fabricating a monolithic PMUT device have complex process flows for forming an electromagnetic shield. Accordingly, a simpler and more efficient method for fabricating a PMUT device, and the resulting PMUT device, are desirable.

SUMMARY

According to various non-limiting embodiments, there may be provided a PMUT device including: a wafer, an active layer may include a piezoelectric stack, an intermediate layer having a cavity formed therein where the intermediate layer is disposed between the wafer and the active layer such that the cavity is adjoining the piezoelectric stack, a via formed through the active layer and the intermediate layer to reach the wafer, and a metallic layer disposed over the active layer and over surfaces of the via. The intermediate layer may include an interposing material surrounding the cavity, and may further include a sacrificial material surrounding the via. The sacrificial material may be different from the interposing material. The metallic layer may include a first member at least substantially overlapping the piezoelectric stack, a second member extending from the first member to the cavity through the active layer, and a third member extending into the active layer to contact an electrode within the active layer.

According to various embodiments, there may be provided a method for fabricating a PMUT device, the method including: providing an intermediate layer on a wafer where the intermediate layer may include an interposing material and a sacrificial material different from the interposing material, forming a cavity in the intermediate layer, arranging an active layer including a piezoelectric stack on the intermediate layer such that the piezoelectric stack in the active layer is adjoining the cavity, forming a via through the active layer and the intermediate layer to reach the wafer where the sacrificial material in the intermediate layer may surround the via, and providing a metallic layer over the active layer and over surfaces of the via. The metallic layer may include a first member at least substantially overlapping the piezoelectric stack, a second member extending from the first member to the cavity through the active layer, and a third member extending into the active layer to contact an electrode within the active layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
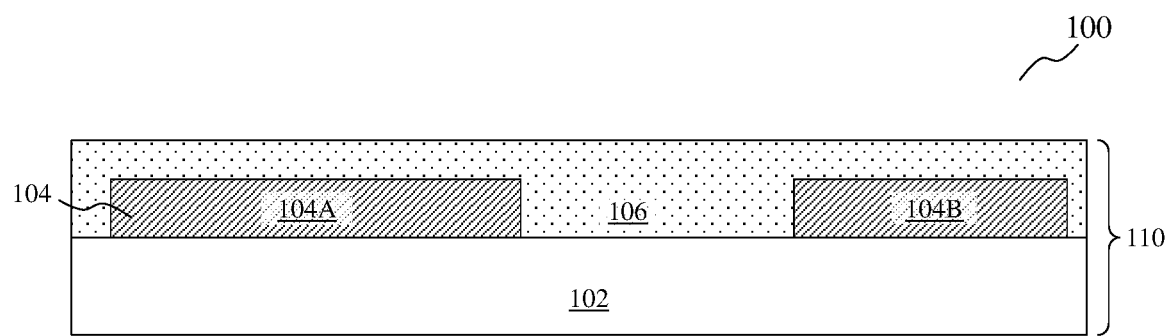
FIGS. 1 to 18 illustrate simplified cross-sectional views that illustrate a process flow for fabricating a PMUT device according to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

According to various non-limiting embodiments, a method for fabricating a PMUT device may include forming an electromagnetic (EM) shield, sealing a cavity and forming electrical contacts in a single process, for example a single metallization process. By forming the electromagnetic shield, sealing the cavity and forming the electrical contacts altogether in one process, the process flow for fabricating the PMUT device may be simplified and may require fewer etching masks. For example, only two masks may be required—one mask to pattern a metallic layer to form an EM shield, a cavity seal and electrical contacts; and another mask to create an opening in a passivation layer, to reveal an electrical contact. In comparison, existing fabrication methods may require four masks to form the same features. For example, a first mask may be required to pattern device contacts; a second mask may be required to form the EM shield; a third mask may be required to form a passivation layer, and a fourth mask may be required to create a contact opening.

The method may also include creating a cavity by releasing a sacrificial material. The sacrificial material may be different from an etch insulation material (also referred herein as an interposing material), so that a single mask may be required to form a release via used for releasing the sacrificial material, as well as for forming an electrode via. The etch insulation material may be used to interpose between the metal layer, the dielectric material, and the sacrificial material. The etch insulation material may be etched to delimit the boundaries of the volume that defines the sacrificial area and the subsequent cavity. Existing fabrication technologies may require a separate mask to be used for each of the formation of the release via and the electrode via.

The method may further include creating an alignment feature for aligning a device, i.e. the transducer to the CMOS wafer. The alignment feature may be created by etching back or planarizing the top metal of the CMOS wafer to create a very small step between the top metal and the dielectric on the CMOS wafer. The alignment feature may serve as an etching barrier. With the alignment feature, the fabrication reliability may be improved even without using a separate mask for alignment.

In view of the above, the method may reduce the fabrication cost, as well as the fabrication cycle duration, by about 50% as compared to existing fabrication technologies.

FIGS. 1 to 18 illustrate simplified cross-sectional views that illustrate a process flow for fabricating a PMUT device according to various embodiments.

FIG. 1 shows a process 100. In the process 100, a wafer 110 may be provided as a starting material for fabricating the PMUT device. The wafer 110 may include a substrate 102. The wafer 110 may further include a wafer metal layer 104 over the substrate 102. The wafer metal layer 104 may include, aluminum (Al) or copper (Cu), or other suitable metals. The wafer metal layer 104 may be patterned to form a first wafer electrode 104A and a second wafer electrode 104B. The wafer 110 may further include a dielectric layer 106 over both the wafer metal layer 104 and over surface area of the substrate 102 that is not covered by the wafer metal layer 104. The dielectric layer 106 may include, or may be formed from, any one of silicon dioxide ($SiO_2$), silicon nitride (SiN), aluminum nitride (AlN), aluminum oxide ($Al_2O_3$), other suitable dielectric materials, or a combination of at least one of these materials. The wafer 110 may be formed by providing a patterned wafer metal layer 104 on the substrate 102, followed by depositing the dielectric layer 106 over the wafer metal layer 104 and the substrate 102. The dielectric layer 106 may serve as a filler, to fill up space between the first wafer electrode 104A and the second wafer electrode 104B so that the wafer 110 may be etched-back or planarized in a subsequent process. The dielectric layer 106 may also serve as an electrical insulator between the first wafer electrode 104A and the second wafer electrode 104B.

Figure 2:
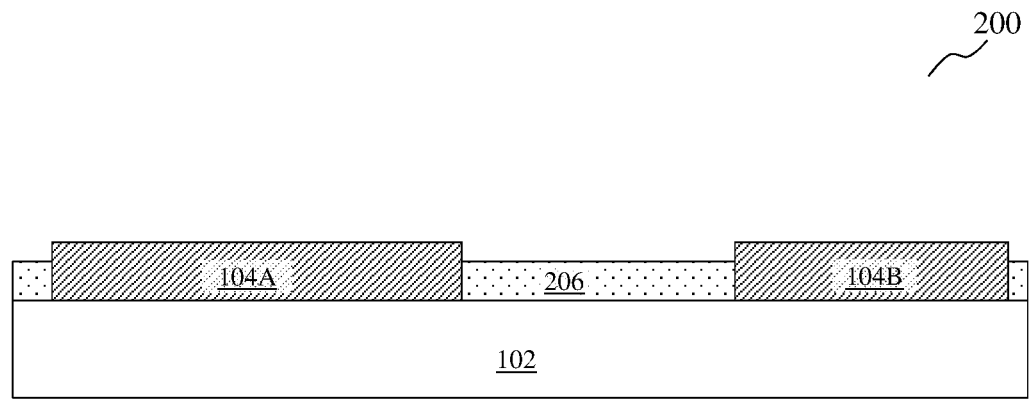

FIG. 2 shows a process 200 where the wafer 110 may be etched back for example by mask-less etch-back or chemical-mechanical planarizing (CMP). After the etch back process, the dielectric layer 106 may become thinner than the wafer metal layer 104. The resultant dielectric layer may be referred herein as the dielectric pass 206. The dielectric pass 206 may be receded relative to the wafer metal layer 104, such as a recession of about 20 nm to about 1 um, for example about 100 nm in a non-limiting embodiment. In other words, the thickness of the dielectric pass 206 may be about 20 nm to about 1 um, for example about 100 nm, lesser than each of the first wafer electrode 104A and the second wafer electrode 104B. The difference in thickness, i.e. height, between the dielectric pass 206 and the wafer metal layer 104, i.e. the wafer electrodes 104A and 104B may provide alignment features and release stop for subsequent processes in fabricating the PMUT device.

Figure 3:
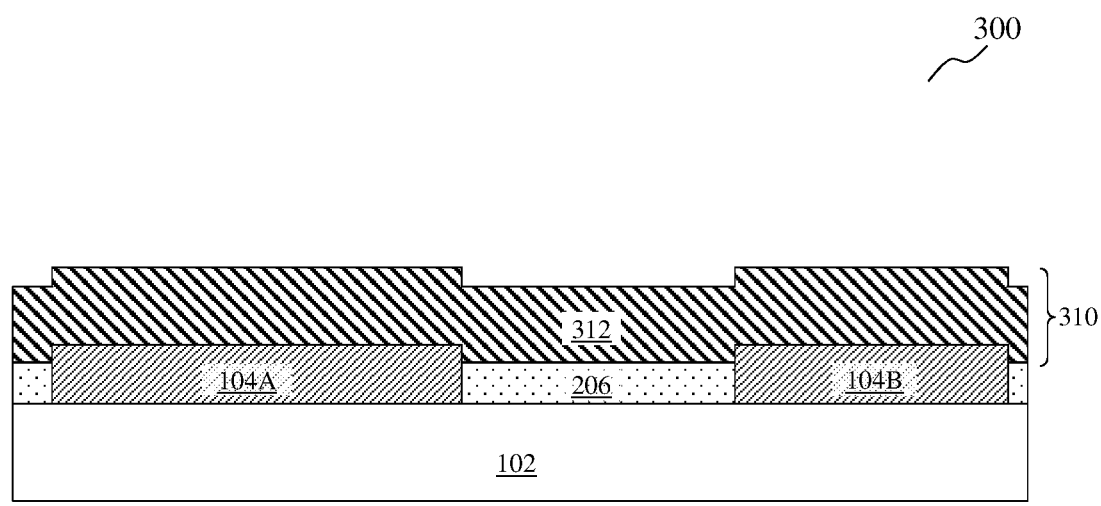

FIG. 3 shows a process 300 where an interposing material 312 may be provided over the wafer metal layer 104 and the dielectric pass 206. The interposing material 312 include an electrically non-conductive, in other words, an electrically insulating material. Alternatively, the interposing material 312 may be a semiconductor material or a conductive material. The interposing material 312 may also be chosen for its suitability to be released during chemical etching. For example, the interposing material 312 may be non-releasable by vapor hydrofluoride (VHF) in a non-limiting embodiment. The interposing material 312 may include, or may be formed, from silicon, AlN, $Al_2O_3$, or combinations thereof, in a non-limiting embodiment. The interposing material 312 may be deposited uniformly to form an interposing layer 310 that may take on the shape or contour of the underlying wafer metal layer 104 and the dielectric pass 206. As a result, the interposing layer 310 may similarly include alignment features, which at least substantially vertically corresponds to the alignment features formed in the process 200.

Figure 4:
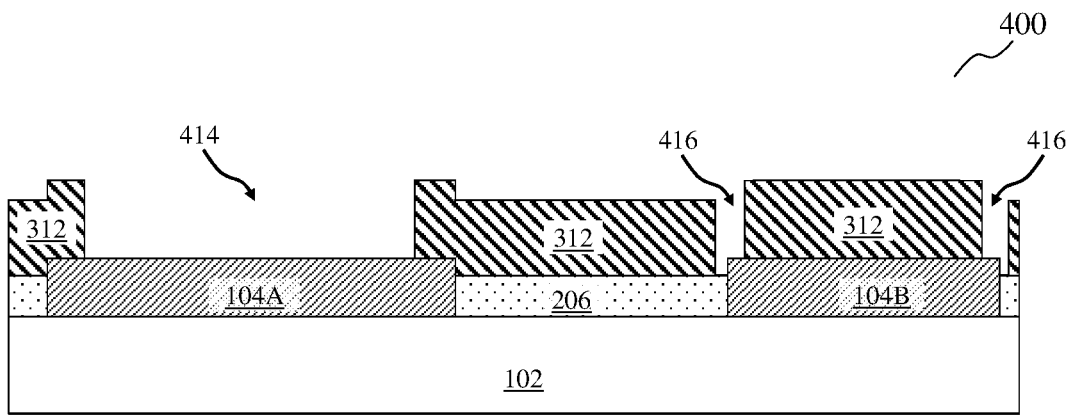

FIG. 4 shows a process 400 where parts of the interposing layer 310 may be removed. The interposing layer 310 may be etched using a first mask (not shown for illustrative convenience) to remove parts of the interposing material 312. The etching process may form a sacrificial area 414 in the interposing layer 310. The sacrificial area 414 may define the area for forming a cavity therein. In other words, the interposing material 312 may be etched to delimit the boundaries of the cavity that may be formed subsequently. The etching process may also form interposing areas 416 in the interposing layer 312. The interposing areas 416 may be formed at least substantially adjacent to, or in place of, the alignment features 308b. The interposing areas 416 may define the area for forming interposing features that may be used in the subsequent process of forming an interconnect via for the PMUT device.

Figure 5:
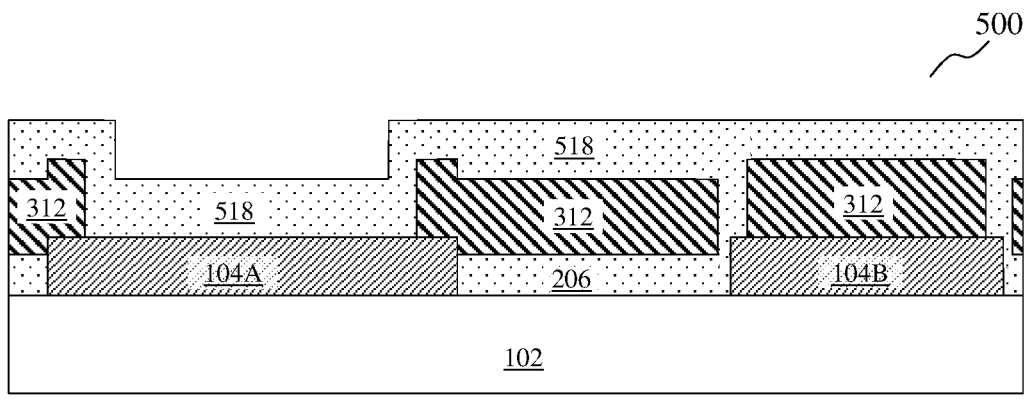

FIG. 5 shows a process 500 where a sacrificial material 518 may be provided on the interposing layer 312. The sacrificial material 518 may be deposited to at least fill up the sacrificial area 414 and the interposing areas 416. The sacrificial material 518 may be a different material from the interposing material 312. The sacrificial material 518 and the interposing material 312 may be resistant to different etching solutions, so that each of the sacrificial material 518 and the interposing material 312 may be independently etched in different process steps. The sacrificial material 518 may include, or may be, a dielectric material in a non-limiting embodiment. The sacrificial material 518 may include the same material as the dielectric layer 106, such that the sacrificial material 518 and the dielectric pass 206 may be homogenous.

Figure 6:
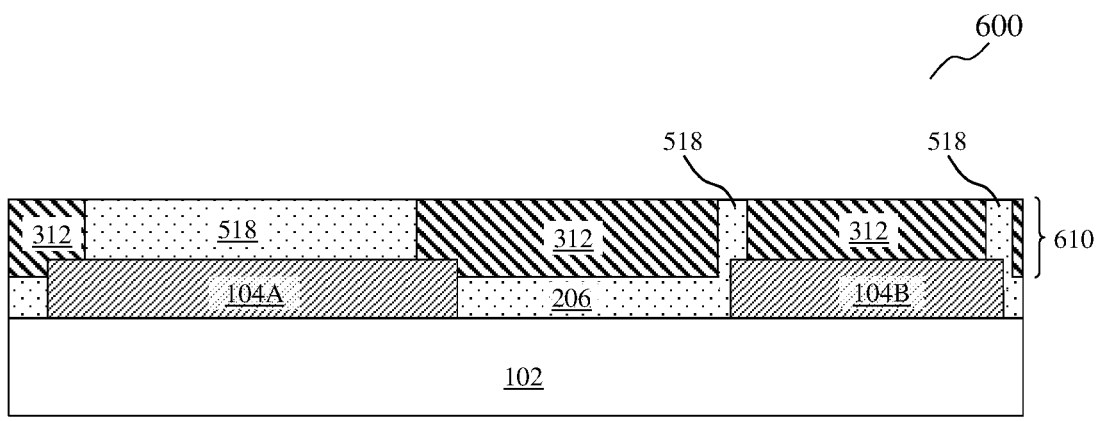

FIG. 6 shows a process 600 where the partially-fabricated device of process 500 may be planarized, for example, by CMP. The sacrificial material 518 and the interposing material 312 may be planarized to form an at least substantially smooth and even surface. The remaining sacrificial material 518 and interposing material 312 may be collectively referred herein as the intermediate layer 610.

Figure 7:
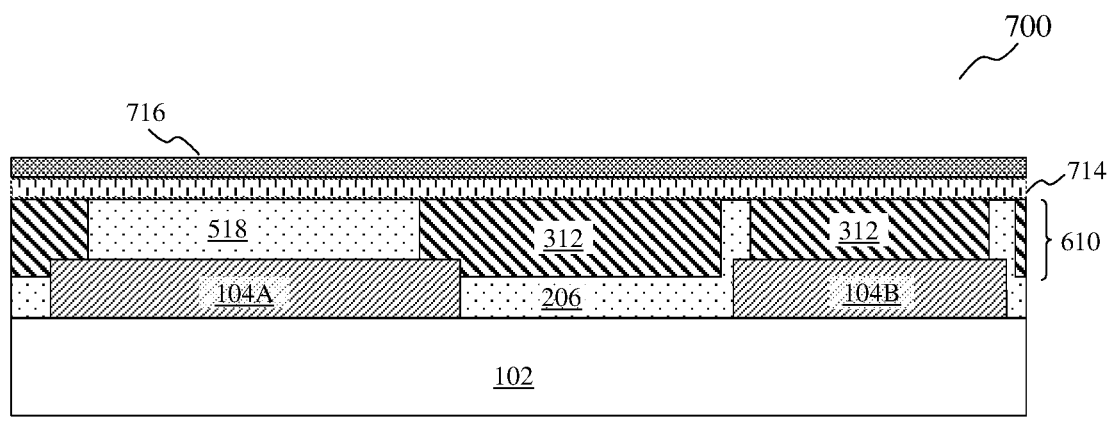

FIG. 7 shows a process 700 where a bottom electrode layer 716 may be formed. The bottom electrode layer 716 may be formed over the intermediate layer 610. The bottom electrode layer 716 may include or may be formed from at least one of molybdenum (Mo), tungsten (W), Al, platinum (Pt) or other suitable metals. An optional seeding layer 714 may be provided between the bottom electrode layer 716 and the intermediate layer 610. The seeding layer 714 may include a piezoelectric material, such as any one of AN, lead zirconate titanate (PZT), polyvinylidene fluoride (PVDF), or combinations thereof.

Figure 8:
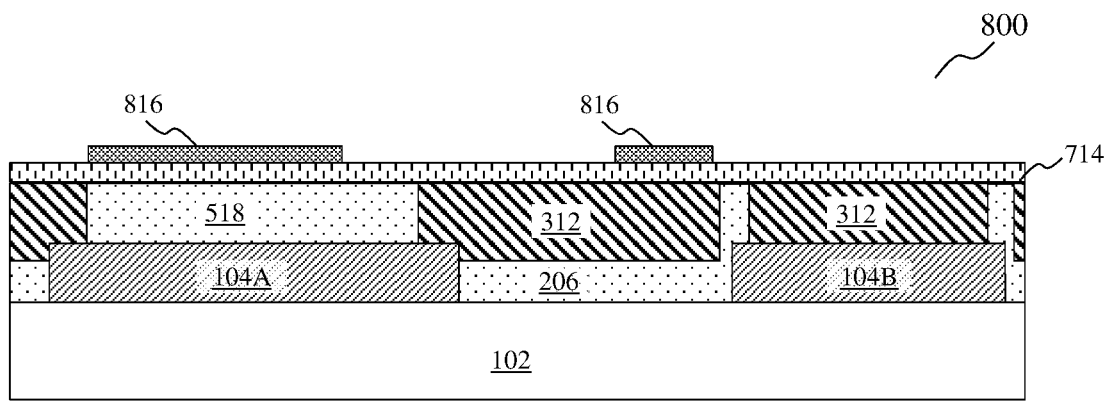

FIG. 8 shows a process 800 where the bottom electrode layer 716 may be patterned to form bottom electrodes 816. The bottom electrodes 816 may be formed by etching the bottom electrode layer 716 using a second mask (not shown for illustrative convenience).

Figure 9:
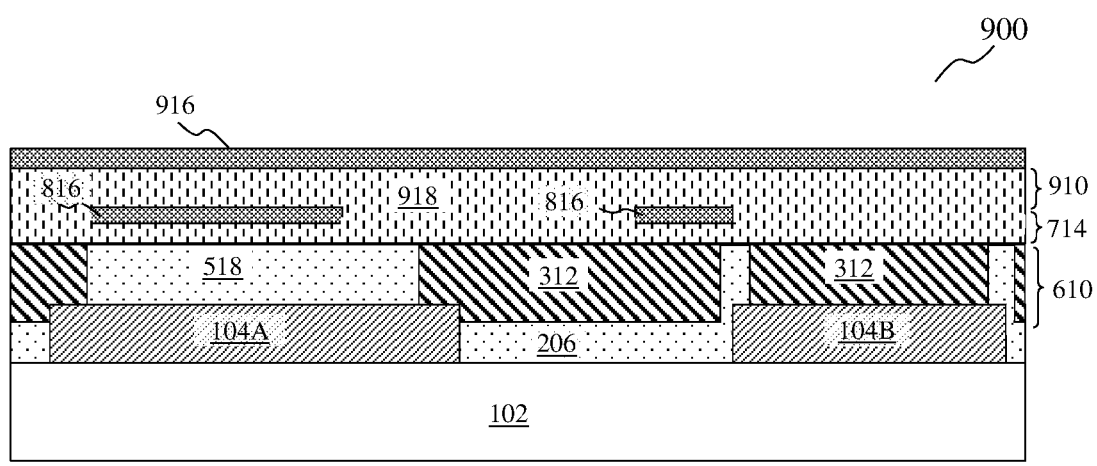

FIG. 9 shows a process 900 where a piezoelectric layer 910 may be formed. The piezoelectric layer 910 may be formed over the bottom electrodes 816, the seeding layer 714 and the intermediate layer 610. The piezoelectric layer 910 may include, or may be formed from, the same material as the seeding layer 714. The piezoelectric layer 910 may include, or may be formed from, a piezoelectric material 918, such as any one of AlN, lead zirconate titanate (PZT), polyvinylidene fluoride (PVDF), or combinations thereof. A top electrode layer 916 may be formed over the piezoelectric layer 910. The top electrode layer 916 may include, or may be formed from, at least one metal, such as molybdenum (Mo), tungsten (W), Al, platinum (Pt), or combinations thereof. The top electrode layer 916 may be at least substantially identical in composition as the bottom electrode layer 716.

Figure 10:
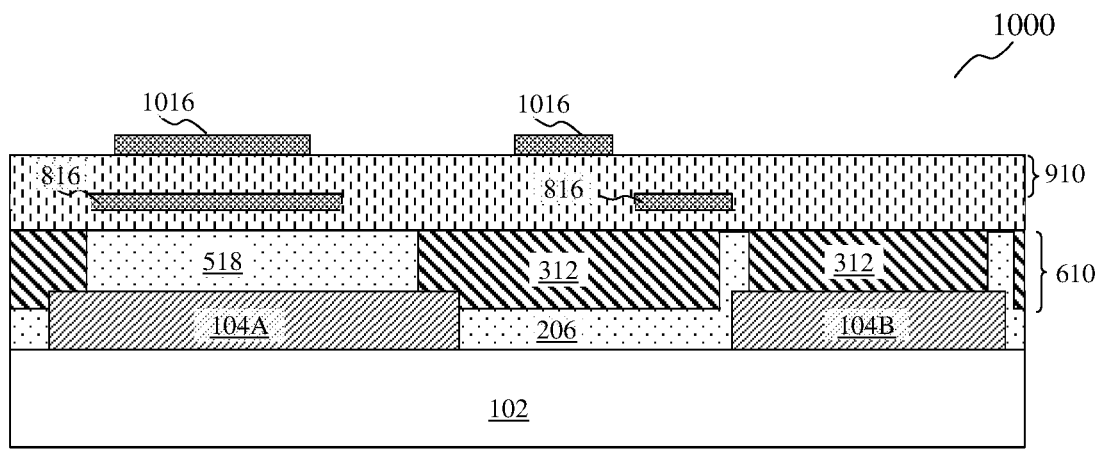

FIG. 10 shows a process 1000 of forming top electrodes 1016. The top electrode layer 916 may be patterned to form the top electrodes 1016. The top electrodes 1016 may be formed by etching the top electrode layer 916 using a third mask (not shown for illustrative convenience).

Figure 11:
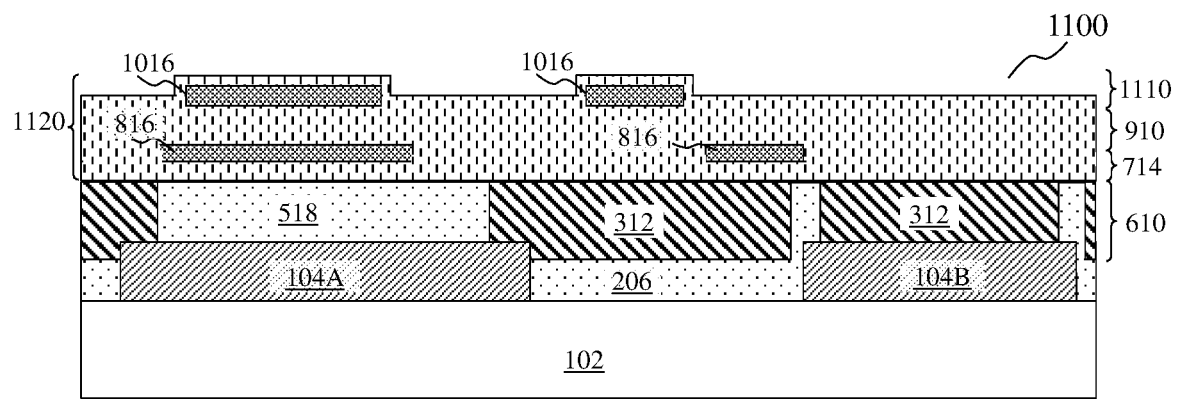

FIG. 11 shows a process 1100. In the process 1100, a buffer layer 1100 may be formed. The buffer layer 1100 may be formed by depositing a buffer material over the top electrode 1016 and the piezoelectric layer 910. The buffer layer 1100 may include any material resistant to etching by VHF, such as but not limited to AN in a non-limiting embodiment. The buffer layer 1100 may include the same material as the piezoelectric layer 910. The piezoelectric layer 910, the top electrode 1016, and the bottom electrode 816 may be collectively referred herein as the active layer 1120. The active layer 1120 may also include the seed layer 714 and/or the buffer layer 1100.

Figure 12:
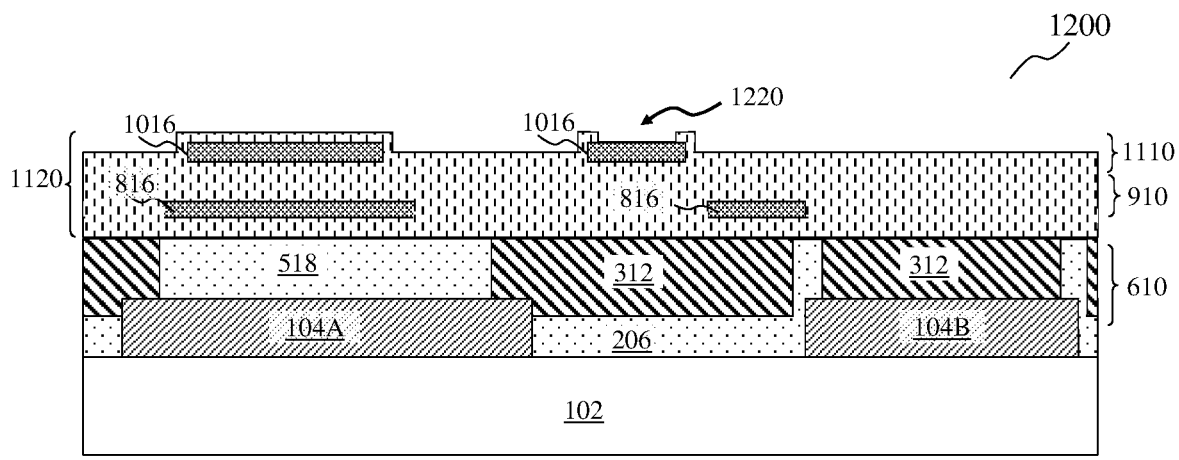

FIG. 12 shows a process 1200. In the process 1200, part of the buffer layer 1100 may be removed to partially expose the top electrode 1016. The buffer layer 1100 may be etched using a fourth mask (not shown for illustrative convenience) to open a top contact via 1220 over the top electrode 1016.

Figure 13:
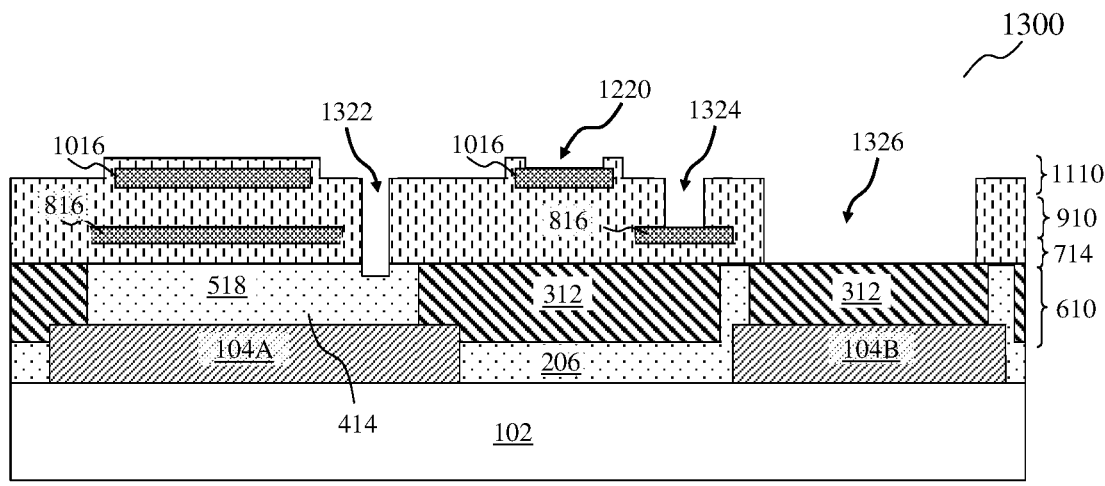

FIG. 13 shows a process 1300 where a plurality of vias may be formed. The plurality of vias may be formed by etching the active layer 1120 using a fifth mask (not shown for illustrative convenience). The buffer layer 1100, the piezoelectric layer 910, and the seed layer 714 may be identical in composition, or may be formed from materials that can be etched using the same etching solution, such that the formation of the vias may be performed in a single etching process. The plurality of vias may include a release via 1322, a bottom contact via 1324, and an interconnect via 1326. The release via 1322 may be formed through the thickness of the active layer 1120 to reach the sacrificial area 414. The release via 1322 may be formed vertically above the first wafer electrode 104A. The bottom contact via 1324 may be formed partially through the active layer 1120 to reach the bottom electrode 816. The interconnect via 1326 may be formed through the thickness of the active layer 1120 to reach the interposing material 312 that lies directly above the second wafer electrode 104B.

Figure 14:
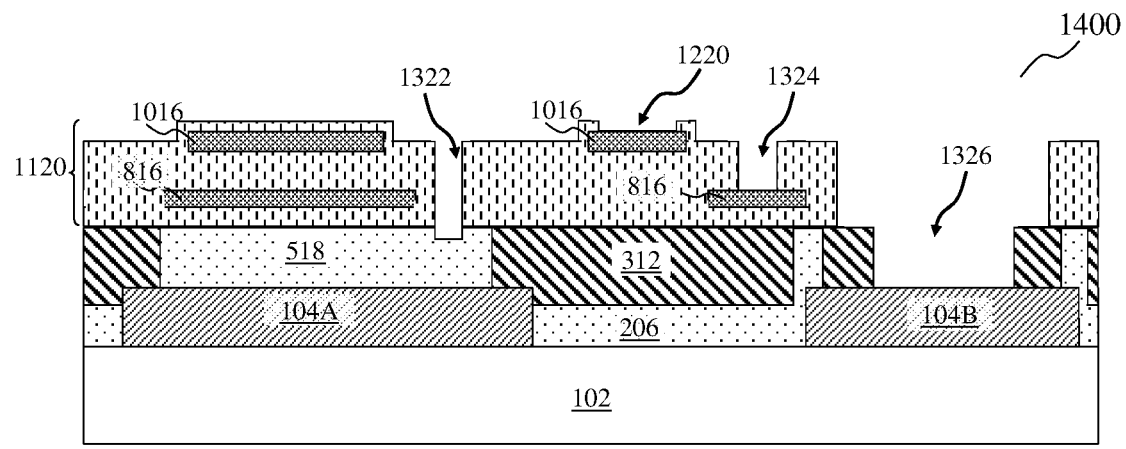

FIG. 14 shows a process 1400. In the process 1400, the partially-fabricated PMUT device of the process 1300 may be further etched using a sixth mask (not shown for illustrative convenience). The sixth mask may expose the interconnect via 1326 to etching. In the process 1400, an etching solution may extend into the interconnect via 1326 to remove interposing material 312 that lies directly above the second wafer electrode 104B. As a result, the interconnect via 1326 may be deepened to reach the second wafer electrode. As the sacrificial material 518 is different from the interposing material 312, and reacts differently with etching solutions, the plurality of vias may be formed in a single etching step.

Figure 15:
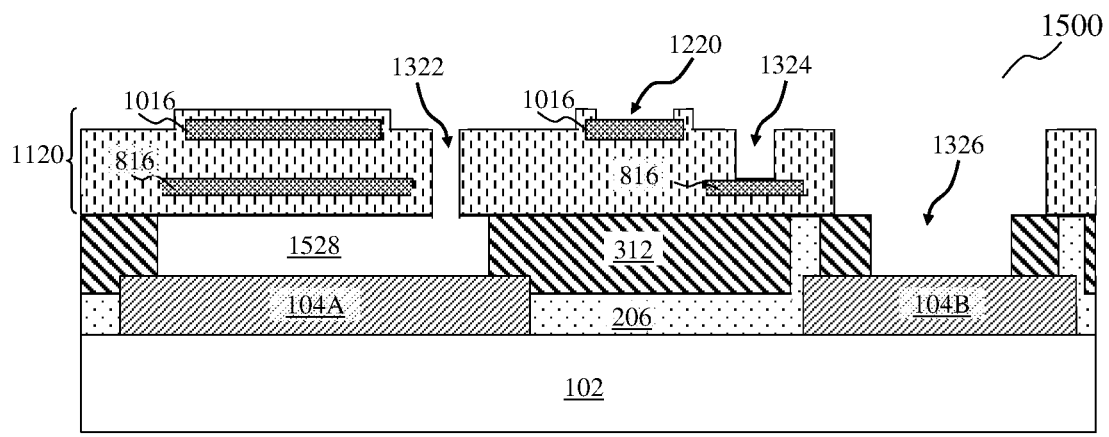

FIG. 15 shows a process 1500. In the process 1500, the sacrificial material 518 that lies directly above the first wafer electrode 104A may be removed through the release via 1322, for example, by release etching. As a result, a cavity 1528 may be formed above the first wafer electrode 104A. The portion of the active layer 1120 that lies at least substantially directly above the cavity 1528 may be referred herein as the piezoelectric stack. The active layer 1120 may be a flexible membrane. The piezoelectric stack may vibrate above the cavity 1528 in response to a voltage difference provided across the top electrode 1016 and the bottom electrode 816. The piezoelectric stack may be the active transducer element of the PMUT device.

Figure 16:
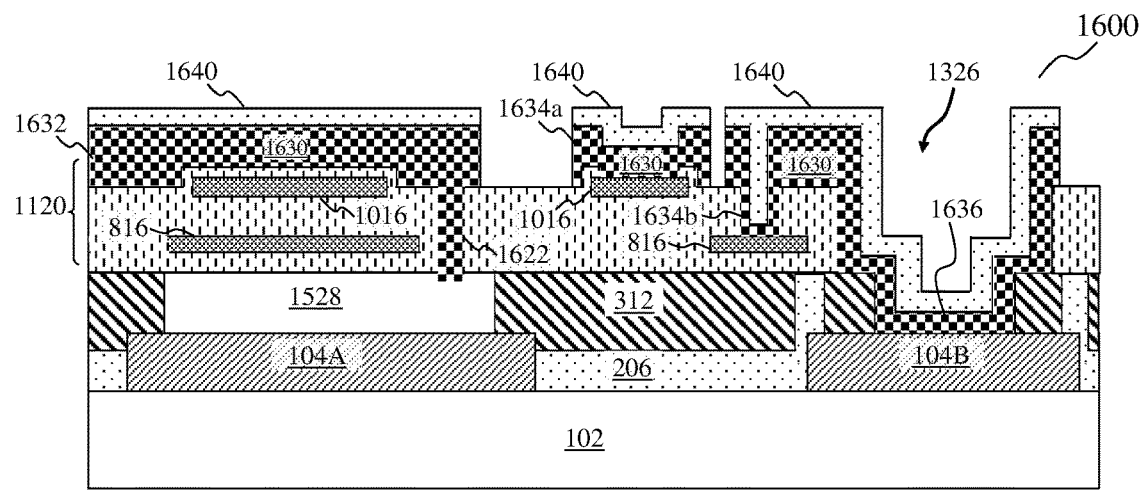

FIG. 16 illustrates a process 1600 which may include metallization of the partially-fabricated device of the process 1500. A metallic layer 1630 may be provided to at least substantially cover or overlap the active layer 1120. The metallic layer 1630 may fill up the release via 1322, thereby forming a metallic pillar 1622 that seals off the release via 1322. The metallic layer 1630 may form a cap 1632 over the piezoelectric stack. The cap 1632 may at least substantially overlap the piezoelectric stack. The cap 1632 may shield the piezoelectric stack from electromagnetic interference. The metallic layer 1630 may extend into the top contact via 1220 to metalize the top electrode 1016. The metallic layer 1630 may also extend into the bottom contact via 1324 to metalize the bottom electrode 816. The metallic pillar 1622 may extend from the cap 1632. The portion of the metallic layer 1630 that contacts the top electrode 1016 is referred herein as the top electrode contact 1634a. The portion of the metallic layer 1630 that contacts the bottom electrode 816 is referred herein as the bottom electrode contact 1634b. The metallic layer 1630 may also include an interconnect contact 1636 which extends into the interconnect via 1326 to metalize the second wafer electrode 104B. The interconnect contact 1636 may contact the second wafer electrode 104B. The metallic layer 1630 may also line the walls of the interconnect via 1426. Cavity sealing, metallization of electrodes and electromagnetic shielding may be achieved through this single process of metallization. The metallic layer 1320 may be a homogenous layer formed from a single metal, for example Al, Cu, or combinations thereof, in a non-limiting embodiment.

A sealing layer 1640 may then be provided over the metallic layer 1630. The sealing layer 1640 may serve as a hard mask for etching the metallic layer 1630. The sealing layer 1640 may also be referred herein as the seventh mask. This etching process may separate the cap 1632 from the top electrode contact 1634a and the bottom electrode contact 1634b, as well as separate the top electrode contact 1634a from the bottom electrode contact 1634b. The bottom electrode contact 1634b may remain connected to the interconnect contact 1636. The cavity 1528 may be protected from any etching or cleaning liquids used in the process 1600, as the sealing layer 1640 together with the metallic layer 1630, may seal the release via 1322.

Figure 17:
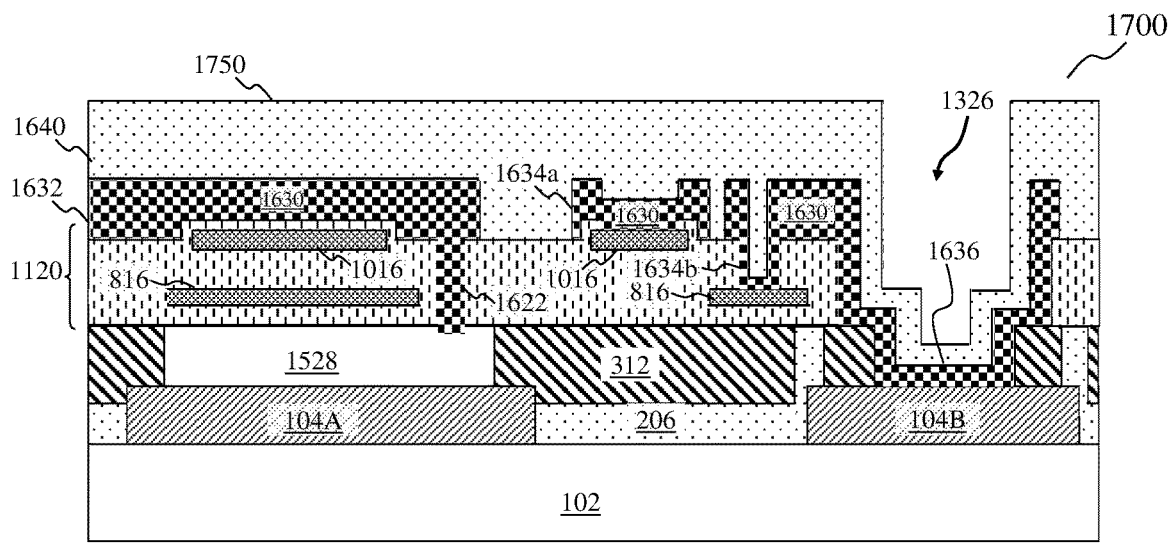

FIG. 17 shows a process 1700. The process 1700 may include providing a passivation layer 1750 over the metallic layer 1630 and also over the exposed portions of the active layer 1120. The passivation layer 1750 may include, or may be formed from a dielectric material, for example, $SiO_2$, SiN, AlN, $Al_2O_3$, or a combination thereof. The passivation layer 1750 may include, or may be formed from, the same material as the dielectric pass 206. The passivation layer 1750 may be elastic, so as to allow the piezoelectric stack to flex. The process 1700 may form a coplanar elastic, sealing, and passivation layer in a single step.

Figure 18:
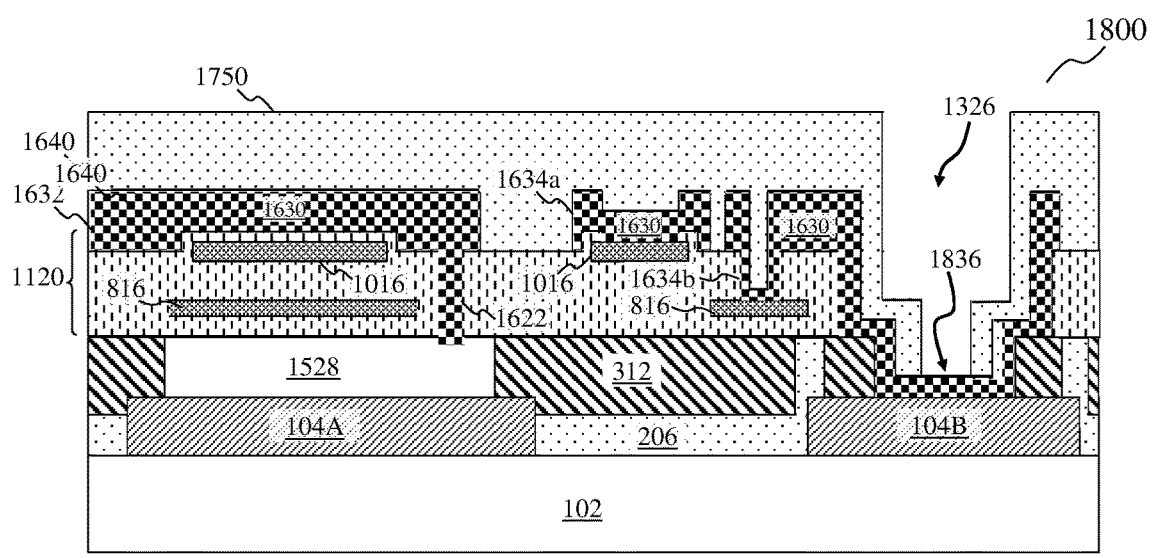

FIG. 18 shows a process 1800 which may include forming a trench in the passivation layer 1750. A portion of the passivation layer 1750 may be removed to form an open pad 1836. The open pad 1836 may reveal the interconnect contact 1636 so that external devices may be electrically coupled to the PMUT device 1880 through the interconnect contact 1636 in the interconnect via 1426. The open pad 1836 may be used for subsequent packaging or external interconnects, for example wire bonding. FIG. 18 also shows the cross-section view of the resulting PMUT device 1880.

According to various non-limiting embodiments, the wafer 110 may be a CMOS device wafer, where the wafer metal layer 104 may be the top metal of the CMOS device wafer. In other words, the first wafer electrode 104A and the second wafer electrode 104B may be CMOS device electrodes. The resulting PMUT device may be a monolithic PMUT device.

According to various non-limiting embodiments, the wafer 110 may be a wafer that does not include any device or circuits. For example, the wafer 110 may be a bare silicon wafer, or a glass wafer. The resulting PMUT device may be a standalone PMUT device. The standalone PMUT device may be wire-bonded to external electrical circuits.

Figure 19:
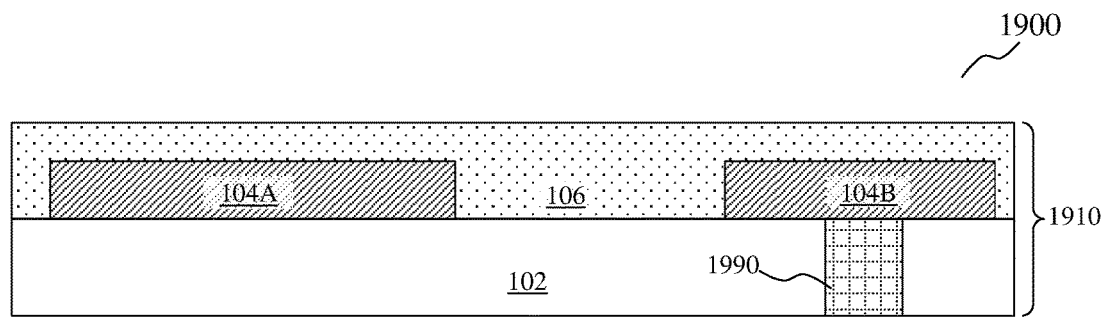
FIGS. 19 to 21 illustrate simplified cross-sectional views that illustrate various processes for fabricating a PMUT device according to various embodiments.
Figure 20:
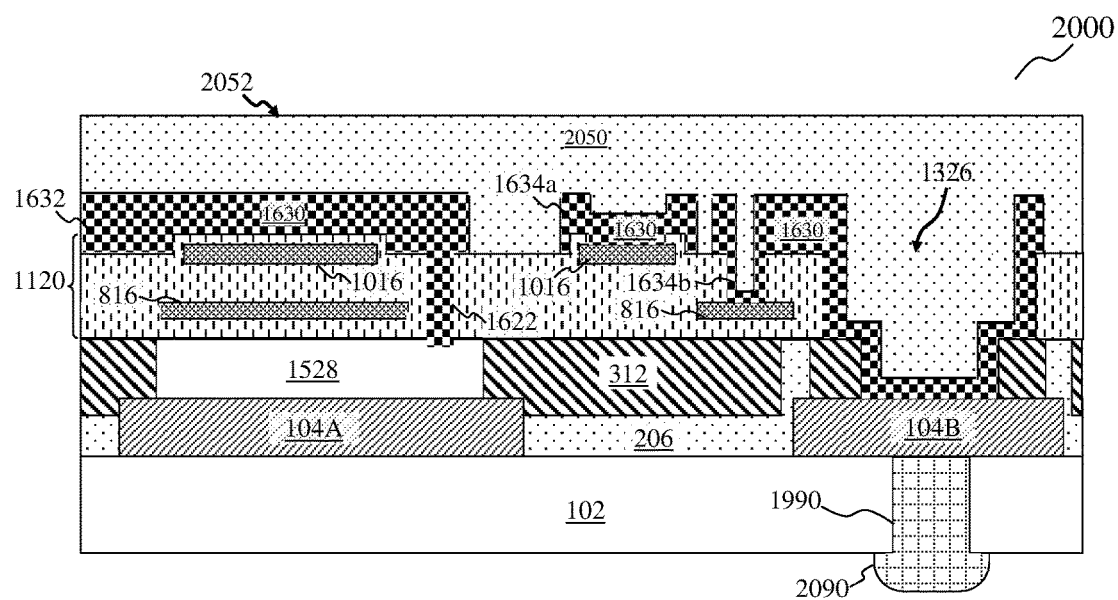
Figure 21:
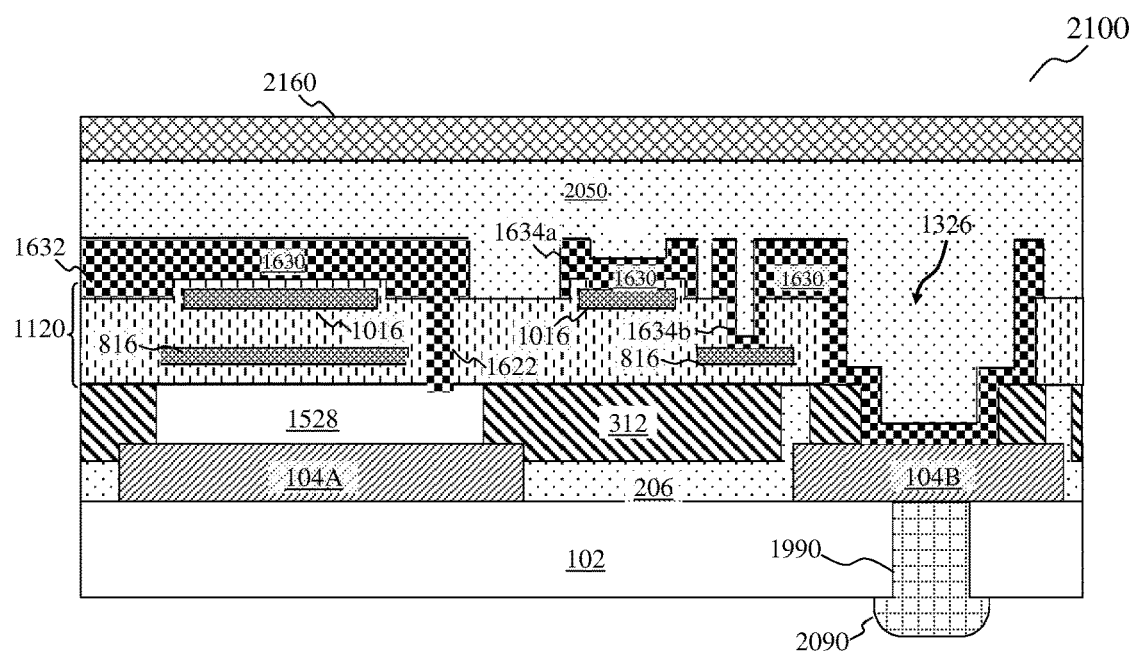

FIGS. 19 to 21 show simplified cross-sectional views that illustrate various processes for fabricating a PMUT device according to various non-limiting embodiments. FIG. 19 illustrates a process 1900 that may be similar to the process 100, in that a wafer 1910 may include a substrate 102, a first wafer electrode 104A, a second wafer electrode 104B, and a dielectric layer 106. The wafer 1910 may further include a substrate via 1990 formed through the thickness of the substrate 102. The substrate 102 may be a silicon wafer, and the substrate via 1990 may be a through-silicon via (TSV) in a non-limiting embodiment. The substrate via 1990 may contact the second wafer electrode 104B. The via 1990 may be filled with a conductive material, for example a metal, such as Al, Cu, or combinations thereof, in a non-limiting embodiment.

FIG. 20 shows a process 2000 performed on the wafer 1910. The process 2000 may include processes 200, 300, 400, 500, 600, 700, 800, 900, 1000, 1100, 1200, 1300, 1400, 1500, and 1600. The process 2000 may further include adding a passivation layer 2050 to the metallic layer 1630. The passivation layer 2050 may be similar to the passivation layer 1750, with the difference that the passivation layer 2050 may fill out the interconnect via 1326, so that the passivation layer 2050 forms a planar surface 2052. The process 2000 may further include depositing an under bump metal (UBM) 2090 under the substrate via 1990.

FIG. 21 illustrates a process 2100 that may include depositing a coupling layer 2160 over the passivation layer 2050. The coupling layer 2160 may include a polymer. The resulting PMUT device 2080 may be coupled to external devices through the UBM 2090. The coupling layer 2160 may allow the PMUT device 2080 to be adhered to, or coupled to, external surfaces.

According to various embodiments, a PMUT device may be provided. The PMUT device may be the PMUT device 1880. The PMUT device may include at least a wafer 102, an intermediate layer 610, an active layer 1120, and a metallic layer 1630. The PMUT device 1880 may include an interconnect via 1326 formed through the active layer 1120 and the intermediate layer 610. The metallic layer 1630 may at be least partially overlaid on the active layer 1120. The active layer 1120 may include a piezoelectric stack. The piezoelectric stack may include a piezoelectric material 918 sandwiched between a pair of electrodes, for example the top electrode 1016 and the bottom electrode 816. The metallic layer 1630 may extend into the interconnect via 1326. The PMUT device 1880 may further include a passivation layer 1750. The passivation layer 1750 may be disposed over the metallic layer 1630 to encapsulate the PMUT device. The passivation layer 1750 may extend into the interconnect via 1326 and onto side walls of the interconnect via 1326. The passivation layer 1750 may coat walls of the interconnect via 1326. The wafer 110 may include a substrate 102. The wafer 110 may further include a first wafer electrode 104A and a second wafer electrode 104B. The wafer 110 may further include a dielectric material 106 or dielectric pass 206 between the first wafer electrode 104A and the second wafer electrode 104B. A thickness of the dielectric material 106 or the dielectric pass 206 may be less than a thickness of each of the first wafer electrode 104A and the second wafer electrode 104B. The intermediate layer 610 may be provided over the wafer 110. The intermediate layer 610 may include an interposing material 312 and a sacrificial material 518. The sacrificial material 518 may be the dielectric material 106, i.e. formed of the same material as the dielectric pass 206. The sacrificial material 518 may adjoin the dielectric material 106 or dielectric pass 206 to at least partially surround part of the second wafer electrode 104B. A cavity 1528 may be formed within the intermediate layer 610. The cavity 1528 may be at least partially surrounded by the interposing material 312. The cavity 1528 may be positioned at least substantially directly above the first wafer electrode 104A. In other words, the cavity 1528 may be formed directly over the first wafer electrode 104A. The interconnect via 1326 may be formed directly above the second wafer electrode 104B. The portion of the metallic layer 1630 that extends into the interconnect via 1326 may be in contact with the second wafer electrode 104B. Within the intermediate layer 610, there may be interposing material 312 surrounding the portion of the metallic layer 1630 that extends into the interconnect via 1326. Sacrificial material 518 or dielectric material 106 in the intermediate layer 610 may isolate the interposing material 312 around the interconnect via 1326, from the rest of the interposing material 312 in the intermediate layer 610. In other words, the interconnect via 1326 may terminate at the second wafer electrode 104B. The base of the interconnect via 1326 may be concentrically surrounded, in order of innermost to outermost, by the metallic layer 1630, the interposing material 312, and the sacrificial material 518 or the dielectric material 106.

The wafer 110 may be a Complementary Metal-Oxide-Semiconductor (CMOS) device wafer. The substrate 102 may be a CMOS device, while the first wafer electrode 104A and the second wafer electrode 104B may be top metal contacts of the CMOS device wafer.

Figure 22:
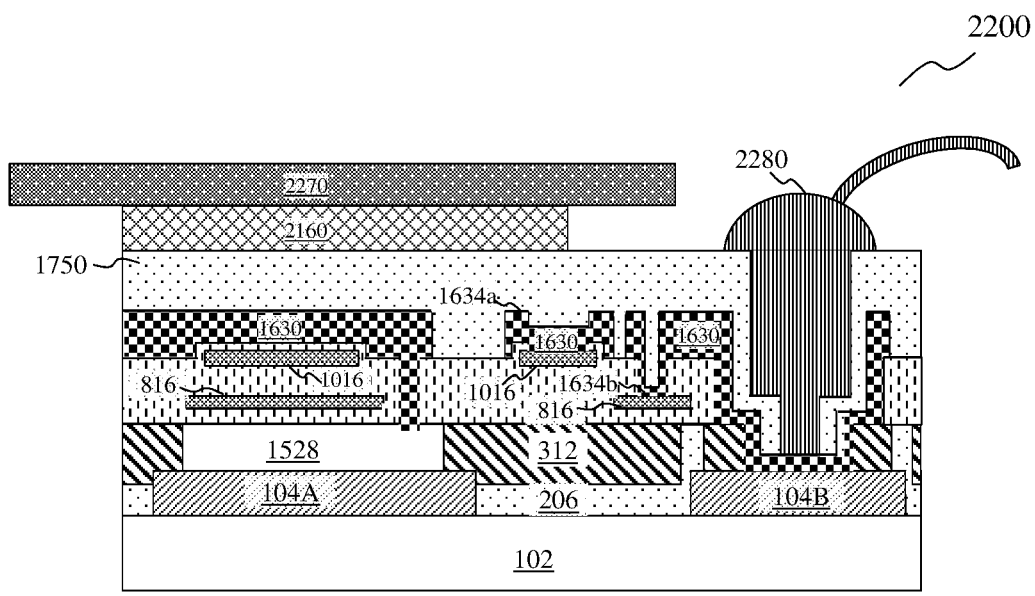
FIG. 22 illustrates a cross-sectional view of the PMUT device in an example of how the PMUT device may be coupled to other devices.

FIG. 22 shows a cross-sectional view 2200 of the PMUT device 1880, in an example of how the PMUT device 1880 may be coupled to other devices. A coupling layer 2160 may be provided over the passivation layer 1750. The coupling layer 2160 may include a polymer, for attaching the PMUT device 1880 to another surface 2270, for example glass. The PMUT device 1880 may be electrically coupled to other devices with an interconnect 2280. The interconnect 2280 may include a conductive material, for example a metal, for wire bonding.

According to various embodiments, a PMUT device may include a wafer, an active layer including a piezoelectric stack, an intermediate layer having a cavity formed therein, the intermediate layer disposed between the wafer and the active layer such that the cavity is adjoining the piezoelectric stack, a via formed through the active layer and the intermediate layer to reach the wafer, and a metallic layer disposed over the active layer and over surfaces of the via. The intermediate layer may include an insulator material surrounding the cavity, and may further include a sacrificial material surrounding the via. The sacrificial material may be different from the insulator material. The metallic layer may include a first member at least substantially overlapping the piezoelectric stack, a second member extending from the first member to the cavity through the active layer, and a third member extending into the active layer to contact an electrode within the active layer. The PMUT device may be the PMUT device 1880 or the PMUT device 2080.

In other words, according to various embodiments, the PMUT device may include a wafer, for example, the wafer 110. The PMUT device may further include an active layer, for example, the active layer 1120. The PMUT device may further include an intermediate layer, for example, the intermediate layer 610. The PMUT device may further include a via, for example, the interconnect via 1326. The PMUT device may further include a metallic layer, for example, the metallic layer 1630. The active layer may include a piezoelectric stack. The intermediate layer may have a cavity, for example, the cavity 1528 formed therein. The intermediate layer may be disposed between the wafer and the active layer, such that the cavity is adjoining the piezoelectric stack. The piezoelectric stack may lie at least substantially directly above the cavity. The via may be formed through the active layer and the intermediate layer to reach the wafer. The metallic layer may be disposed over the active layer and over surfaces of the via. The intermediate layer may include an insulator material, for example the interposing material 312, that may surround the cavity. The intermediate layer may also include a sacrificial material, for example the sacrificial material 518, that surrounds the via.

The sacrificial material may be different from the insulator material. The metallic layer may include a first member, a second member and a third member. The first member may be the cap 1632. The first member may at least substantially overlap the piezoelectric stack. The first member may electromagnetically shield the piezoelectric stack. The second member may be the metallic pillar 1622. The second member, may extend from the first member to the cavity through the active layer. The third member, may be the electrode contacts 1634a and 1634b which may extend into the active layer to contact at least an electrode within the active layer. The electrode may be, for example, the top electrode 1016 or the bottom electrode 816.

Figure 23:
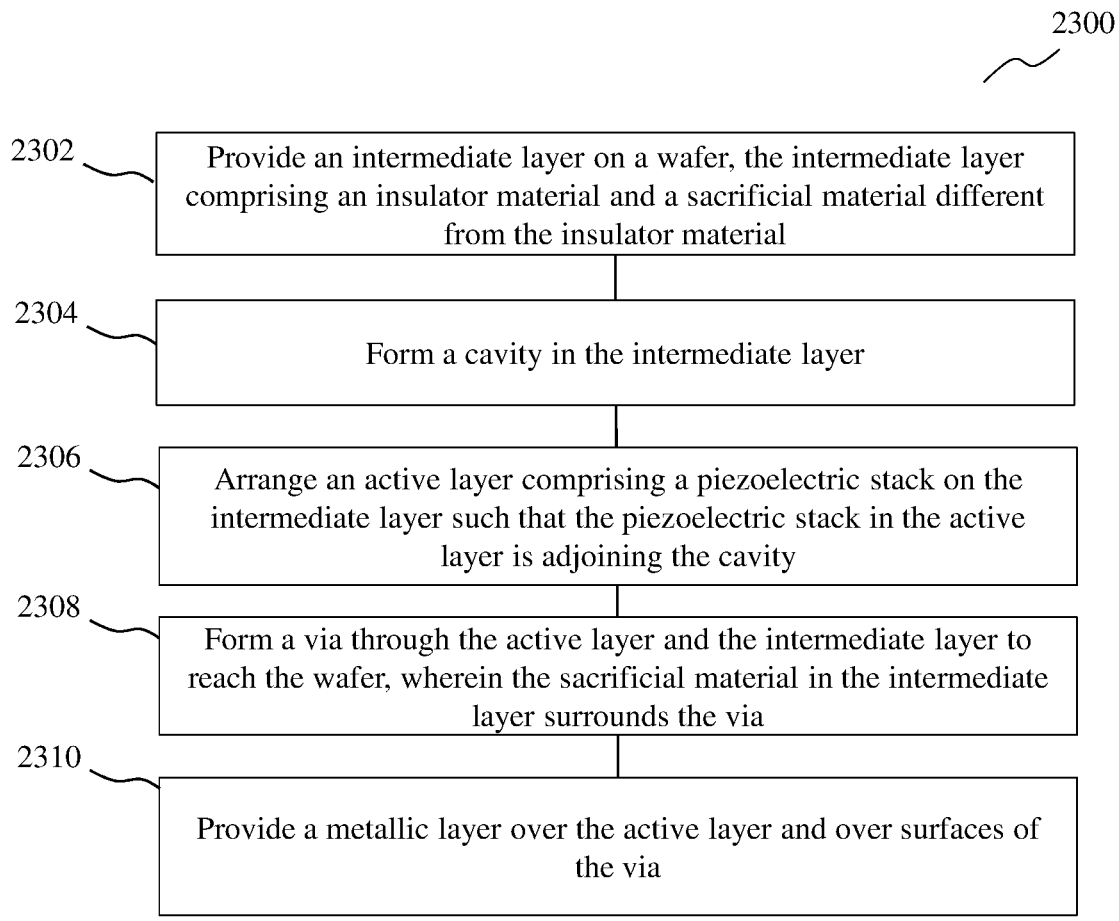
FIG. 23 illustrates a flow diagram illustrating a method for fabricating a PMUT device according to various embodiments.

FIG. 23 shows a flow diagram 2300 illustrating a method for fabricating a PMUT device according to various embodiments. The method may include processes 2302, 2304, 2306, 2308 and 2310. The process 2302 may include providing an intermediate layer on a wafer. The intermediate layer may include an insulator material and a sacrificial material different from the insulator material. The process 2302 may include the processes 300, 400, 500 and 600. The process 2302 may further include the process 200, where alignment features may be formed by etching back or planarizing the wafer to expose a first wafer electrode and a second wafer electrode. The process 300 may include deposition an insulation material over the wafer. The process 400 may include removing a first portion of the interposing material lying directly over a first wafer electrode to form the first wafer electrode opening. The process 400 may also include removing a second portion of the interposing material lying directly over a periphery of the second wafer electrode to form the second wafer electrode opening. The process 500 may include depositing the sacrificial material into the first wafer electrode opening and the second wafer electrode opening. The process 600 may include planarizing the interposing material and the sacrificial material. The process 2304 may include forming a cavity in the intermediate layer. The process 2304 may include the processes 1300 and 1500. The process 1300 may include etching the active layer to form a release via and a contact via. The release via may extend to the sacrificial material lying directly over the first wafer electrode. The contact via may extend to the sacrificial material lying directly over one or more active layer bottom electrodes. The process 1500 may include removing the sacrificial material lying directly over the first wafer electrode. The process 2306 may include arranging an active layer including a piezoelectric stack on the intermediate layer such that the piezoelectric stack in the active layer is adjoining the cavity. The process 2306 may include the processes 700, 800, 900 and 1000. The process 700 may include providing an active layer bottom electrode layer. The process 900 may include providing a piezoelectric material over the active layer bottom electrode layer. The process 800 may include patterning the active layer bottom electrode layer. The process 1000 may include patterning the active layer top electrode layer. The process 2306 may optionally include the process 1100. The process 2308 may include forming a via through the active layer and the intermediate layer to reach the wafer, wherein the sacrificial material in the intermediate layer surrounds the via, also referred herein as the interconnect via. The process 2308 may include the processes 1300 and 1400. The process 2310 may include providing a metallic layer over the active layer and over surfaces of the via. The process 2310 may include the process 1600. The process 1600 may include depositing metal over the active layer. The metal may coat a section of the active layer corresponding to the piezoelectric stack to form a first member. The metal may seal the release via to form a second member. The metal may coat the contact via to form a third member. The metallic layer may include the first member at least substantially overlapping the piezoelectric stack, the second member extending from the first member to the cavity through the active layer and the third member extending into the active layer to contact an electrode within the active layer. The method may further include a further process of disposing a passivation layer over the metallic layer and into the via, such that the passivation layer covers side walls of the via. This further process may include the process 1700. The method may further include a second further process of removing part of the passivation layer in the via to expose the metallic layer on a via bottom surface. The via bottom surface may be at least substantially perpendicular to the side walls of the via. This second further process may include the process 1800.

The following examples pertain to further embodiments.

Example 1 is a piezoelectric micromachined ultrasonic transducer (PMUT) device including: a wafer; an active layer including a piezoelectric stack; an intermediate layer having a cavity formed therein, the intermediate layer disposed between the wafer and the active layer such that the cavity is adjoining the piezoelectric stack; a via formed through the active layer and the intermediate layer to reach the wafer; and a metallic layer disposed over the active layer and over surfaces of the via; wherein the intermediate layer includes an interposing material surrounding the cavity, and further includes a sacrificial material surrounding the via; wherein the sacrificial material is different from the interposing material; and wherein the metallic layer includes: a first member at least substantially overlapping the piezoelectric stack; a second member extending from the first member to the cavity through the active layer; and a third member extending into the active layer to contact an electrode within the active layer.

In example 2, the subject-matter of example 1 can optionally include that the wafer includes: a substrate; a first wafer electrode and a second wafer electrode on the substrate; and a dielectric material between the first wafer electrode and the second wafer electrode.

In example 3, the subject-matter of example 2 can optionally include that the cavity is formed directly over the first wafer electrode.

In example 4, the subject-matter of example 2 or 3 can optionally include that a thickness of the dielectric material is less than a thickness of each of the first wafer electrode and the second wafer electrode.

In example 5, the subject-matter of any one of examples 2 to 4 can optionally include that the sacrificial material in the intermediate layer adjoins the dielectric material to surround part of the second wafer electrode.

In example 6, the subject-matter of any one of examples 1 to 5 can optionally include that the wafer is a Complementary Metal-Oxide-Semiconductor (CMOS) device wafer.

In example 7, the subject-matter of any one of examples 1 to 6 can optionally include that the sacrificial material is a dielectric material.

In example 8, the subject-matter of any one of examples 1 to 7 can optionally include that the piezoelectric stack includes a piezoelectric material sandwiched between a pair of electrodes of the active layer.

In example 9, the subject-matter of any one of examples 1 to 8 can optionally include a passivation layer disposed over the metallic layer to encapsulate the PMUT device.

In example 10, the subject-matter of example 9 can optionally include that the passivation layer extends onto side walls of the via.

In example 11, the subject-matter of any one of examples 1 to 10 can optionally include that the first member electromagnetically shields the piezoelectric stack.

Example 12 is a method for fabricating a PMUT device, the method including: providing an intermediate layer on a wafer, the intermediate layer including an interposing material and a sacrificial material different from the interposing material; forming a cavity in the intermediate layer; arranging an active layer including a piezoelectric stack on the intermediate layer such that the piezoelectric stack in the active layer is adjoining the cavity;

forming a via through the active layer and the intermediate layer to reach the wafer, wherein the sacrificial material in the intermediate layer surrounds the via; providing a metallic layer over the active layer and over surfaces of the via, the metallic layer including: a first member at least substantially overlapping the piezoelectric stack; a second member extending from the first member to the cavity through the active layer; and a third member extending into the active layer to contact an electrode within the active layer.

In example 13, the subject-matter of example 12 can optionally include that providing the intermediate layer on the wafer includes: forming alignment features on the wafer by etching back the wafer to expose a first wafer electrode and a second wafer electrode.

In example 14, the subject-matter of example 12 or 13 can optionally include that providing the intermediate layer on the wafer includes: depositing the interposing material over the wafer; removing a first portion of the interposing material lying directly over a first wafer electrode to form a first wafer electrode opening; removing a second portion of the interposing material lying directly over a periphery of the second wafer electrode to form a second wafer electrode opening; depositing the sacrificial material into the first wafer electrode opening and the second wafer electrode opening; and planarizing the interposing material and the sacrificial material.

In example 15, the subject-matter of example 14 can optionally include that forming a cavity in the intermediate layer includes: etching the active layer to form a release via and a contact via, wherein the release via extends to the sacrificial material lying directly over the first wafer electrode, and wherein the contact via extends to the sacrificial material lying directly over one or more active layer bottom electrodes; and removing the sacrificial material lying directly over the first wafer electrode.

In example 16, the subject-matter of example 15 can optionally include that providing the metallic layer includes: depositing metal over the active layer, wherein the metal coats a section of the active layer corresponding to the piezoelectric stack to form the first member; wherein the metal seals the release via to form the second member, wherein the metal coats the contact via to form the third member.

In example 17, the subject-matter of any one of examples 12 to 16 can optionally include that arranging an active layer on the intermediate layer includes: providing an active layer bottom electrode layer; providing a piezoelectric material over the active layer bottom electrode layer; providing an active layer top electrode over the piezoelectric material; and patterning each of the active layer top electrode layer and the active layer bottom electrode layer to form the piezoelectric stack.

In example 18, the subject-matter of any one of examples 12 to 17 can optionally include disposing a passivation layer over the metallic layer and into the via, such that the passivation layer covers side walls of the via.

In example 19, the subject-matter of example 18 can optionally include removing part of the passivation layer in the via to expose the metallic layer on a via bottom surface, the via bottom surface being at least substantially perpendicular to the side walls.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A piezoelectric micromachined ultrasonic transducer (PMUT) device comprising:
   a wafer;
   an active layer comprising a piezoelectric stack;
   an intermediate layer having a cavity formed therein, the intermediate layer disposed between the wafer and the active layer such that the cavity is adjoining the piezoelectric stack;
   a via formed through the active layer and the intermediate layer to reach the wafer; and
   a metallic layer disposed over the active layer and over surfaces of the via;
   wherein the intermediate layer comprises an interposing material surrounding the cavity, and further comprises a sacrificial material surrounding the via;
   wherein the sacrificial material is different from the interposing material; and
   wherein the metallic layer comprises:
      a first member at least overlapping the piezoelectric stack;
      a second member extending from the first member to the cavity through the active layer, filling up a release via passing through the active layer and disposed above the cavity, and not passing through the cavity; and
      a third member extending into the active layer to contact an electrode within the active layer.

2. The PMUT device of claim 1, wherein the wafer comprises:
   a substrate;
   a first wafer electrode and a second wafer electrode on the substrate; and
   a dielectric material between the first wafer electrode and the second wafer electrode.

3. The PMUT device of claim 2, wherein the cavity is formed directly over the first wafer electrode.

4. The PMUT device of claim 2, wherein a thickness of the dielectric material is less than a thickness of each of the first wafer electrode and the second wafer electrode.

5. The PMUT device of claim 2, wherein the sacrificial material in the intermediate layer adjoins the dielectric material to surround part of the second wafer electrode.

6. The PMUT device of claim 1, wherein the wafer is a Complementary Metal-Oxide-Semiconductor (CMOS) device wafer.

7. The PMUT device of claim 1, wherein the sacrificial material is a dielectric material.

8. The PMUT device of claim 1, wherein the piezoelectric stack comprises a piezoelectric material sandwiched between a pair of electrodes of the active layer.

9. The PMUT device of claim 1, further comprising:
   a passivation layer disposed over the metallic layer to encapsulate the PMUT device.

10. The PMUT device of claim 9, wherein the passivation layer extends onto side walls of the via.

11. The PMUT device of claim 1, wherein the first member electromagnetically shields the piezoelectric stack.

12. A method for fabricating a PMUT device, the method comprising:

providing an intermediate layer on a wafer, the intermediate layer comprising an interposing material and a sacrificial material different from the interposing material;

forming a cavity in the intermediate layer;

arranging an active layer comprising a piezoelectric stack on the intermediate layer such that the piezoelectric stack in the active layer is adjoining the cavity;

forming a via through the active layer and the intermediate layer to reach the wafer, wherein the sacrificial material in the intermediate layer surrounds the via;

forming a release via passing through the active layer and above the cavity;

providing a metallic layer over the active layer and over surfaces of the via, the metallic layer comprising:
 a first member at least overlapping the piezoelectric stack;
 a second member extending from the first member to the cavity through the active layer, filling up the release via, and not passing through the cavity; and
 a third member extending into the active layer to contact an electrode within the active layer.

13. The method of claim 12, wherein providing the intermediate layer on the wafer comprises:
forming alignment features on the wafer by etching back the wafer to expose a first wafer electrode and a second wafer electrode.

14. The method of claim 12, wherein providing the intermediate layer on the wafer comprises:
depositing the interposing material over the wafer;
removing a first portion of the interposing material lying directly over a first wafer electrode to form a first wafer electrode opening;
removing a second portion of the interposing material lying directly over a periphery of the second wafer electrode to form a second wafer electrode opening;
depositing the sacrificial material into the first wafer electrode opening and the second wafer electrode opening; and
planarizing the interposing material and the sacrificial material.

15. The method of claim 14, wherein forming a cavity in the intermediate layer comprises:
etching the active layer to form the release via and a contact via,
wherein the release via extends to the sacrificial material lying directly over the first wafer electrode, and
wherein the contact via extends to the sacrificial material lying directly over one or more active layer bottom electrodes; and
removing the sacrificial material lying directly over the first wafer electrode.

16. The method of claim 15, wherein providing the metallic layer comprises:
depositing metal over the active layer,
wherein the metal coats a section of the active layer corresponding to the piezoelectric stack to form the first member;
wherein the metal seals the release via to form the second member,
wherein the metal coats the contact via to form the third member.

17. The method of claim 12, wherein arranging an active layer on the intermediate layer comprises:
providing an active layer bottom electrode layer;
providing a piezoelectric material over the active layer bottom electrode layer;
providing an active layer top electrode over the piezoelectric material; and
patterning each of the active layer top electrode layer and the active layer bottom electrode layer to form the piezoelectric stack.

18. The method of claim 12, further comprising:
disposing a passivation layer over the metallic layer and into the via, such that the passivation layer covers side walls of the via.

19. The method of claim 18, further comprising:
removing part of the passivation layer in the via to expose the metallic layer on a via bottom surface, the via bottom surface being at least perpendicular to the side walls.

\* \* \* \* \*